United States Patent [19]
Morgan et al.

[11] Patent Number: 5,591,314
[45] Date of Patent: Jan. 7, 1997

[54] APPARATUS FOR AFFIXING A ROTATING CYLINDRICAL MAGNETRON TARGET TO A SPINDLE

[76] Inventors: Steven V. Morgan, 253 Mark West Station Rd., Windsor, Calif. 95492; Johan Vanderstraeten, Industriezone E.376 Laan 75-59 B-9800, Deinze, Belgium; Erwin Vanderstraeten, Industriezone E.376 Laan 75-59 B-9800, Deinze, Belgium; Guy Gobin, Industriezone E.376 Laan 75-59 B-9800, Deinze, Belgium

[21] Appl. No.: 549,246

[22] Filed: Oct. 27, 1995

[51] Int. Cl.$^6$ .................................. C23C 14/35
[52] U.S. Cl. ........................................ 204/298.22
[58] Field of Search .................... 204/298.21, 298.22

[56] References Cited

U.S. PATENT DOCUMENTS

| | | | |
|---|---|---|---|
| 4,407,713 | 10/1983 | Zega | 204/298.22 |
| 5,096,562 | 3/1992 | Boozenny et al. | 204/298.22 |
| 5,100,527 | 3/1992 | Stevenson et al. | 204/298.22 |
| 5,171,411 | 12/1992 | Hillendahl et al. | 204/192.12 |
| 5,298,137 | 3/1994 | Marshall, III | 204/192.12 |
| 5,445,721 | 8/1995 | Bower | 204/192.12 |
| 5,518,592 | 5/1996 | Bower et al. | 204/192.12 |

*Primary Examiner*—Aaron Weisstuch
*Attorney, Agent, or Firm*—Larry D. Johnson

[57] ABSTRACT

An apparatus to releasably affix a rotating cylindrical magnetron target to a spindle utilizes a threaded spindle collar engaging threads on the outside surface of the target, with a single water-to-vacuum seal located at the target and spindle interface. The threads may be removable from the target, enabling efficient assembly/disassembly and recycling.

9 Claims, 2 Drawing Sheets

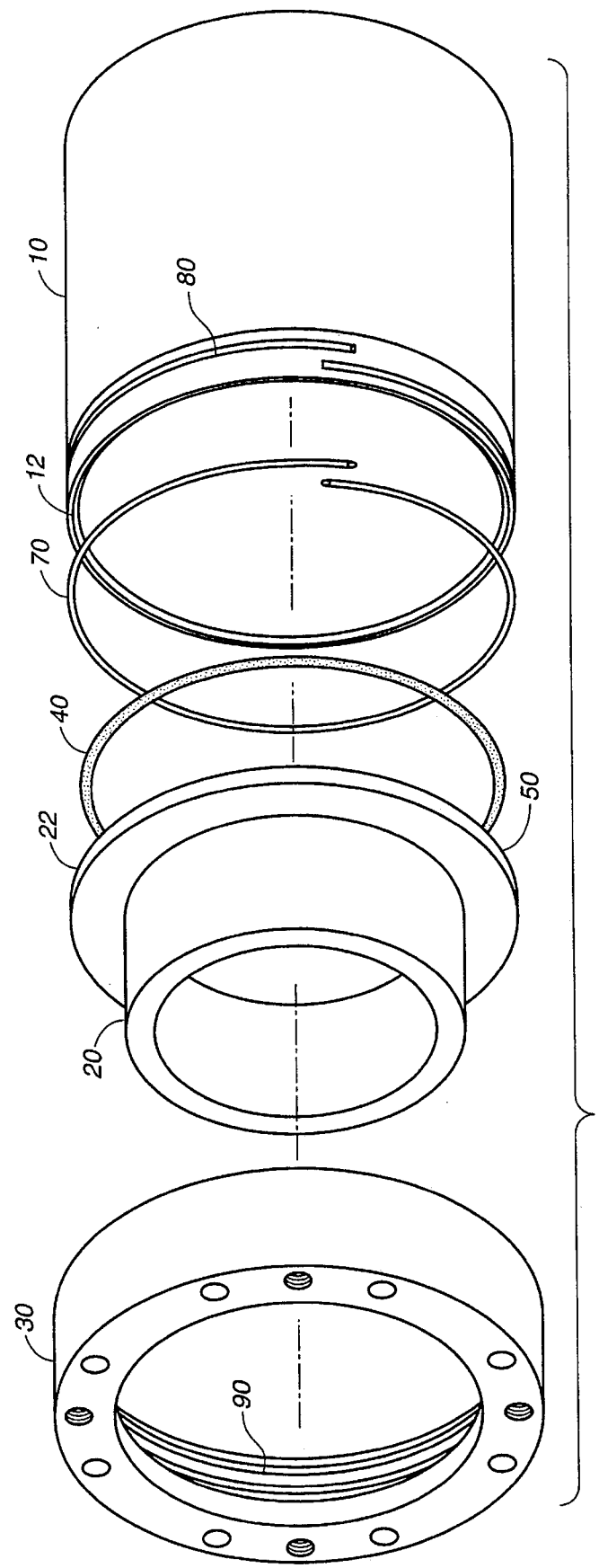
FIG._1

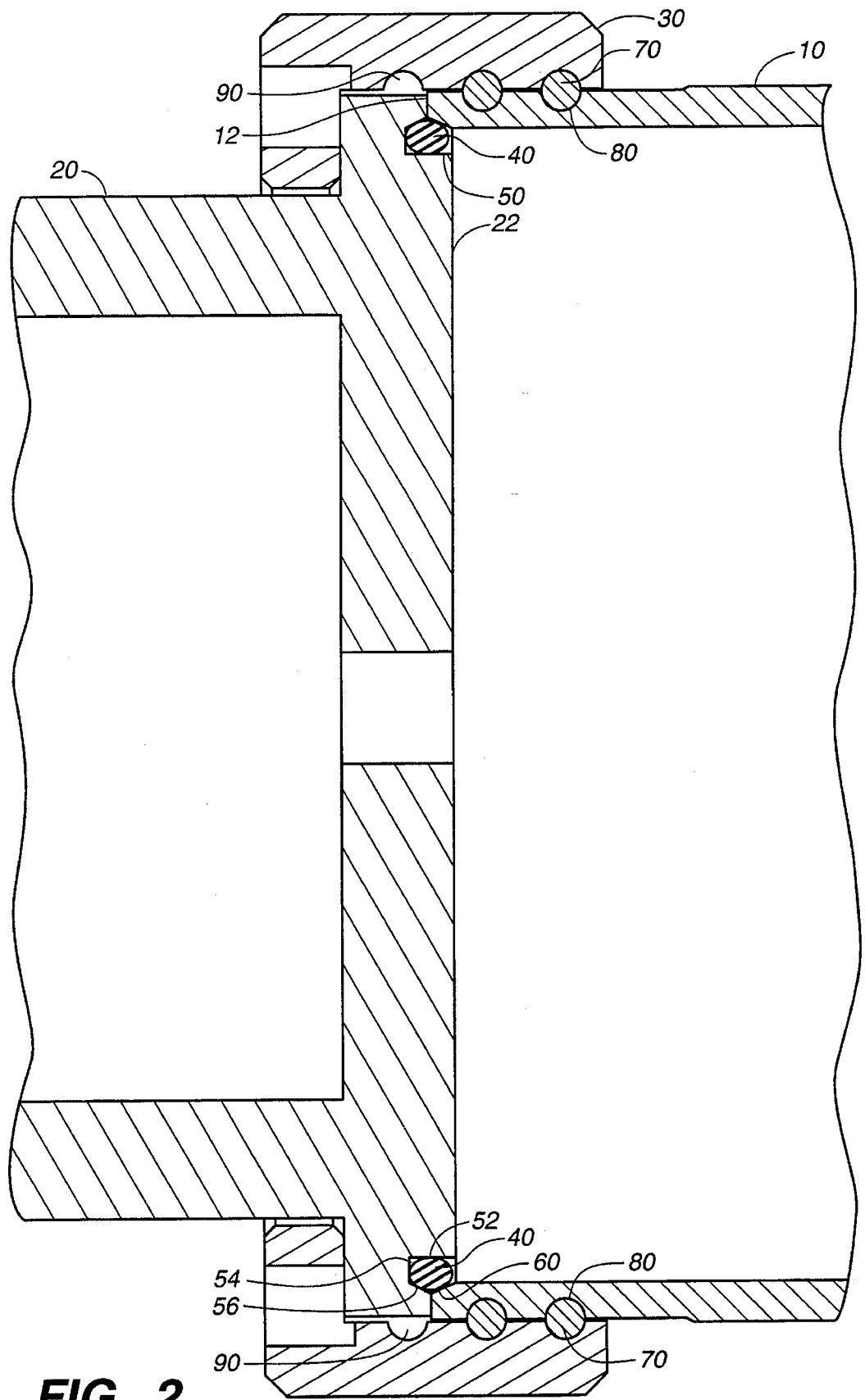
FIG._2

APPARATUS FOR AFFIXING A ROTATING CYLINDRICAL MAGNETRON TARGET TO A SPINDLE

BACKGROUND OF THE INVENTION

1. Field of the Invention

This invention relates generally to a rotating cylindrical magnetron apparatus, and more specifically to an improved method and apparatus for affixing the target of such an apparatus to its support spindle.

2. Description of the Prior Art

This invention relates directly to an apparatus used for magnetron sputtering utilizing rotating, cylindrical shaped targets. The cylindrical targets are used to deposit various materials onto a variety of substrates, typically, but not limited to, glass substrates. The materials are deposited in a vacuum chamber using a reactive gas, magnetron sputtering technique. The principles and operation of one such apparatus are described in detail in Boozenny et al. U.S. Pat. No. 5,096,562, describing a large-scale cylindrical sputtering apparatus used for sputtering coatings on architectural glass panels, automobile windshields, and the like.

There are several advantages for using a rotating cathode apparatus, as opposed to a flat magnetron system. Some of the advantages include higher deposition rates, higher target material inventory (utilization) per cathode, low maintenance frequency and better cost efficiency, all as compared to a planar magnetron.

Another major advantage for using a cylindrical target, as opposed to a planar target, is that a rotating cylindrical target can successfully sputter silicon compounds, for example $Si_3N_4$ and $SiO_2$. These compounds are extremely difficult to produce using a planar target, as is taught by Wolfe et al. U.S. Pat. No. 5,047,131.

The foregoing are advantages in principle, but have not been proven to be advantages in fact. While a considerable amount of effort has been spent developing the apparatus used for rotating cylindrical targets, the advantages have not been demonstrated in practice. The apparatus which has been used for sputtering with cylindrical cathodes on large scale substrates has failed to demonstrate most of the above-noted advantages, with the exception of being able to sputter Si using reactive gases used to form Si compounds. However, while it has been possible to sputter reactive Si compounds, the reliability issues related to the cylindrical target apparatus overshadow the advantages.

The cylindrical target apparatus, as described in Boozenny et al., prohibits the possible advantages from being achieved, due to frequent mechanical break-downs resulting in significant loss of production time. A common source for mechanical failures of the rotatable cathode are water leaks occurring at the interface of the support spindle and cylindrical target. In order to make the rotatable cathode efficient and to accommodate the required cooling and magnet assemblies, it is necessary that a detachable cylindrical support spindle be employed in the design to support the target structure on at least one end of the target. The reason for employing a detachable support spindle is to allow access and removal of the cooling and magnet assemblies during target replacement. Further, providing a detachable spindle mechanism provides a more efficient method for the manufacturing of the cylindrical targets.

A major consideration in the design of a detachable support spindle is that this interface represents one of the most critical sealing areas of the cathode system. This is due to the fact that any seal at the spindle-to-target interface is subjected to high vacuum on one side of the seal surface, and high water pressure on the opposite side of the seal surface, representing an extreme condition for a seal.

Another consideration for a detachable support spindle is the number of seals that are utilized in the design. Therefore, it becomes most desirable to minimize the sealing surface to a single seal, thereby minimizing the possible locations for water-to-vacuum leaks within the vacuum chamber to a single location, as opposed to multiple locations.

Yet another consideration for the spindle-to-target interface is where and how the seal is placed with respect to the detachable support spindle and the target's sealing surface(s). To minimize the possibility of water-to vacuum leaks within the vacuum chamber it is advisable to place the seal in an area of this interface where the sealing surfaces are least likely to be damaged during the handling, cleaning and replacement of the target structure. Therefore, placement of the seal at the end of the target, on a flat surface, perpendicular to the target surface, should be avoided. Also, the seal itself should be prevented from any movement during the process of attaching the spindle to the target, and that during this process the seal should be compressed in a uniform manor, so that an equal and continuous force is exerted during the compression of the seal.

Still another consideration for the detachable support spindle is to provide a quick and easy methodology for removing the detachable support spindle from the target during the process of maintenance, repair, and replacement of the target. However, the spindle-to-target interface can be subjected to extremely high axial and radial forces. These high forces can be created by a combination of factors. The length, weight, rigidity and concentricity of the cylindrical target account for some the factors that contribute to the high forces involved. Another contributing factor is the high temperature that is applied to the target during the sputtering process, causing thermal expansion of the target, both longitudinally and radially. It is therefore not advisable to incorporate any clamping structures to the inside circumference of the cylindrical target for the purpose of affixing the support spindle structure to the target structure, and/or for the purpose of compressing the seal at the spindle-to-target interface.

Yet another important factor for consideration is that the support spindle must accommodate the rotation of the target in either a clockwise or counter-clockwise direction during the sputtering process. The methodology employed for a quick and easy removal system should comply with all of the above mentioned considerations.

Another consideration for a detachable support spindle is that the attachment methodology should allow for an efficient and uncomplicated means of recycling the support cylinders that are often used to carry the target materials used for sputtering. For example, in some cases a cylindrical support structure must be utilized for the sputtering of materials that do not have enough mechanical strength to support themselves (e.g., Silicon or other materials that are either too soft or too brittle). From an efficiency standpoint, the support structures should have the capability to be recycled. Therefore, it becomes important to consider the method of attaching the support spindle to such a cylinder.

OBJECTS AND ADVANTAGES

It is therefore an object of the present invention to provide various features to safeguard against water-to-vacuum leaks at the spindle-to-target interface of a rotating cylindrical target.

It is a further object of the present invention to improve the speed and simplicity of removing and re-installing the support spindle to a rotating cylindrical target.

Yet another object of the present invention is to provide a fixation structure of sufficient strength to overcome the extreme mechanical forces that are exerted at the spindle-to-target interface.

It is a still further object of the present invention to provide an efficient method to enable the recycling of the cylindrical support structure which may be used to support various sputtering materials.

Other objects and advantages will be obvious to a person skilled in the art from the following description of the present invention.

SUMMARY OF THE INVENTION

The method and apparatus for affixing a rotating cylindrical magnetron target to a spindle of this invention provides various structural features and techniques used to accomplish the foregoing objectives for improving the reliability of a rotating cylindrical magnetron cathode.

One feature of the present invention is the strategic placement of the water-to-vacuum seals located on at least one end of a rotating cylindrical target and support spindle structure interface, and to limit the number of seals at this location to a single seal. Further to the issue of strategic placement of this seal, this invention provides a structural feature whereby the vacuum integrity of the seal is maximized.

Another feature of the present invention is to provide a structural technique whereby the seal will not move or rotate during the assembly process of affixing the support spindle to the rotating cylindrical target, and that a uniform and constant pressure will be exerted during compression of the seal, thereby preventing damage to the seal during the assembly process of attaching the support spindle to the cylindrical target.

A further feature of the present invention incorporates a fixation method whereby attaching the support spindle to the cylindrical target is accomplished by using the outer circumferential surface on at least one end of the cylindrical target itself. Employing this method provides adequate structural strength to overcome the mechanical forces that are exerted at the spindle-to-target interface. An added advantage of this fixation method is that it provides a quick and easy technique for removing the support spindle from the cylindrical target due to the convenient accessibility of the fixation mechanism.

Yet another feature of the present invention is a removable thread system located on at least one end of the cylindrical target, which is utilized as part of the fixation mechanism described above. The advantage of the removable thread system is that it provides a method whereby the cylindrical target support structure can be efficiently recycled. Also, since the threads are removable, the material used for the threads can be dissimilar to that of the materials used for the support spindle and cylindrical target support structures. This is an important factor when considering the effect of the similar metals utilized for thread systems used in a vacuum environment where high temperatures are commonplace. For example, stainless-steel thread systems in such an environment tend to bond together so that separation of the threaded parts can become difficult or even impossible, and may cause damage to the parts during separation.

BRIEF DESCRIPTION OF THE DRAWINGS

FIG. 1 is an exploded perspective view of an apparatus for affixing a rotating cylindrical magnetron target to a spindle of this invention, illustrating a support spindle, cylindrical target, fixation ring, seal groove and removable thread configuration; and FIG. 2 is a side elevation cross-sectional view of the affixing apparatus of this invention.

DETAILED DESCRIPTION OF A PREFERRED EMBODIMENT

A rotating cylindrical magnetron target is supported by a spindle on at least one end, in the case of a single support spindle system, and at both ends, in the case of double support system. In this description only one end of the target will be described, since in the case of a double-ended support system, both spindle-to-target interfaces are symmetrical.

There are two types of cylindrical targets to be considered. The first type is a solid cylinder composed of the material that will be sputtered and ultimately be deposited on the passing substrate. These cylinders are made of materials that are strong enough to support themselves over the required length. This type of target is known as an "unsupported" target. The materials that can be used in the "unsupported" form include, for example, titanium, stainless steel or niobium. The second type of target is for those materials to be sputtered that do not have the mechanical strength required to support themselves over the required length of the target (such as Silicon). Therefore, a supporting cylinder or "backing tube" must be used to carry the material being sputtered. The "backing tube" would then be composed of a material with sufficient mechanical strength to support itself and the sputter material it carries. This type of target is known as a "supported" target.

For the purposes of this disclosure, the "supported" target type will be discussed, since it represents a more difficult situation for the target-to-spindle interface and sealing requirements. The reason for the high level of difficulty involved with a "supported" target, as opposed to an "unsupported" target, is that for the "supported" target the surface area that can be utilized for the mating surface of the spindle flange is relatively small by comparison.

The purpose of the spindle is to support the cylindrical target and maintain the proper position of the target while it rotates about its longitudinal central axis. The spindle is also used to compress the o-ring seal used to prevent the cooling liquid, typically water, from escaping at the spindle-to-target interface. The spindle consists of a hollow shaft with a flange on one end. The flanged end of the shaft should be of sufficient outside diameter such that the outside diameter of the flange and the outside diameter of the target (backing tube) are nearly equal, thus providing the maximum contact area for the two mating surfaces (the end of the spindle flange and the end of the backing tube).

Located on the end of the flanged surface of the spindle is a circular O-ring groove, providing three (3) contact surfaces for the O-ring. The outer radial surface of the O-ring groove is chamfered or angled, thereby providing maximum surface for the O-ring. An opposing chamfered or angled surface is also provided at the mating end of the target, located on the inside circumference of the end of the target, and that surface contains an opposing and inverse angle to the angled surface located on the spindle. When the spindle is assembled to the target, the O-ring groove in the flange and the chamfered area of the target form the O-ring groove in its entirety. When the O-ring is compressed into the spindle's O-ring groove and the chamfered area at the end of the target, the O-ring will make contact with four distinct surfaces; three surfaces in the spindle's O-ring groove and one surface on the target chamfered end. This arrangement then allows uniform compression of the O-ring by the spindle and the target, and also allows the pressure of the cooling liquid (water) to further enhance uniform compression of the O-ring.

The method whereby the spindle is attached to the target is accomplished by employing a threaded collar ring that slips over the spindle, and particularly the flanged end of the spindle. The collared area of the spindle ring has a surface parallel or nearly parallel to the outer surface of the flange. The collared area of the spindle ring is used to apply thrust to the spindle flange. The inner circumferential surface of the spindle ring contains a continuous spiral groove, making at least two (2) revolutions on its surface, for the preferred embodiment of the present invention. The spiral groove located in the inner surface of the spindle ring serves as a thread that is used to tighten the spindle ring onto the end of the target.

Located on the end of the target (or backing tube) is a corresponding and complementary spiral groove having an equal and matching longitudinal pitch to that of the groove on the spindle ring. The spiral groove located on the target end makes slightly more than one complete revolution around the target for the preferred embodiment of the present invention. A spring is then inserted, but not permanently affixed, within the groove provided for at the end of the target. The spring's radial surface preferably conforms to the radius of the groove at the end of the target, and wraps around the outside of the target. Together, the spiral groove and the spring inserted into the spiral groove at the end of the target form the thread mechanism utilized by the matching spiral groove located within the spindle ring. The spindle ring is then screwed onto the end of the target until the end of the flange and the target end make contact, thereby completing the fixation of the spindle to the target. Proper tightening of the spindle ring completes the fixation of the spindle onto the target, and provides uniform o-ring compression, with sufficient axial and longitudinal strength.

Referring now to the drawings, the method of attaching spindle 20 to the end of cylindrical target 10 is accomplished by screwing spindle ring 30 over the outer circumference of target 10. During the tightening process, spindle ring 30 aligns and draws the flanged surface 22 of spindle 20 onto the mating surface 12 at the end of target 10. As the two mating surfaces 12, 22 (the flange surface of spindle 20 and the mating surface of target 10) make contact, O-ring 40 is uniformly compressed into O-ring groove 50. Groove 50 has three contact surfaces 52, 54 and 56, with contact surface 56 preferably forming an obtuse angle relative to contact surface 54, to provide maximum surface for the O-ring. O-ring groove 50 is of sufficient depth so as to insure against over-compression of O-ring 40. Upon completing the tightening process, O-ring groove 50 and chamfer surface 60 on the end of target 10 form the completed sealing surfaces utilized by O-ring 40.

The thread mechanism utilized by spindle ring 30 is accomplished by inserting spring 70 into the spiral groove 80 provided on the outside circumferential surface of target 10. Conforming to the spiral pitch of groove 80, the spring then forms the mating thread surface for complementary groove 90 on the inner circumferential surface of spindle ring 30. Because spring 70 is not permanently affixed into groove 80, spring 70 can be removed from target 10 upon disassembly when the sputtering material has been depleted, thereby providing an efficient method for recycling of the backing tube.

While this invention has been described in connection with preferred embodiments thereof, it is obvious that modifications and changes therein may be made by those skilled in the art to which it pertains without departing from the spirit and scope of the invention. Accordingly, the scope of this invention is to be limited only by the appended claims and their legal equivalents.

What is claimed as invention is:

1. An apparatus for affixing a rotating cylindrical magnetron target structure to a spindle, said target used to deposit sputtered coatings onto a variety of large substrates, said apparatus comprising:

a spindle member including a hollow shaft terminating in a flange portion having an end surface, said end surface including an O-ring in a circular O-ring groove, said flange portion having a diameter;

a cylindrical target structure having a threaded outside circumferential surface and an end surface, said target structure having a diameter generally equal to said spindle member flange portion diameter; and a collar ring having a threaded inner circumferential surface, said collar ring adapted to fit over said spindle member flange portion to engage said cylindrical target threaded outside circumferential surface and releasably secure said cylindrical target end surface to said spindle member end surface adjacent said O-ring.

2. The apparatus of claim 1 wherein said collar ring inner circumferential surface contains a continuous spiral groove making at least two revolutions on its surface.

3. The apparatus of claim 2 wherein said cylindrical target structure threaded outside circumferential surface comprises a spiral groove having an equal and matching longitudinal pitch to that of said collar ring continuous spiral groove, and said cylindrical target structure spiral groove makes at least one complete revolution around said target outside circumferential surface.

4. The apparatus of claim 3 wherein said cylindrical target structure threaded outside circumferential surface spiral groove includes a spring member which is inserted but not permanently affixed within said target structure spiral groove.

5. The apparatus of claim 4 wherein said spring member includes a radial surface conforming to said target structure spiral groove.

6. The apparatus of claim 1 wherein said spindle member flange portion circular O-ring groove provides at least three contact surfaces for said O-ring.

7. The apparatus of claim 6 wherein said spindle member flange portion circular O-ring groove provides at least one chamfered contact surface.

8. The apparatus of claim 7 wherein said cylindrical target structure end surface includes a chamfered surface.

9. The apparatus of claim 8 wherein said target structure chamfered end surface comprises an opposing and inverse angle to said spindle member flange portion O-ring groove chamfered surface.

* * * * *